(12) United States Patent
Roh et al.

(10) Patent No.: US 6,569,971 B2
(45) Date of Patent: *May 27, 2003

(54) POLYMERS FOR PHOTORESIST AND PHOTORESIST COMPOSITIONS USING THE SAME

(75) Inventors: Chi Hyeong Roh, Kyoungki-do (KR); Jae Chang Jung, Kyoungki-do (KR)

(73) Assignee: Hyundai Electronics Industries Co., Ltd. (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/383,475

(22) Filed: Aug. 26, 1999

(65) Prior Publication Data

US 2002/0049287 A1 Apr. 25, 2002

(30) Foreign Application Priority Data

Aug. 27, 1998 (KR) .................................. 1998-35029
Aug. 28, 1998 (KR) .................................. 1998-35291

(51) Int. Cl.$^7$ ............................................. C08G 85/00
(52) U.S. Cl. ................... 526/258; 526/259; 526/270; 526/271; 526/272; 526/313; 526/348.4; 430/296; 430/270
(58) Field of Search ................. 526/272, 259, 526/271, 169, 313, 348.4, 258; 430/296, 270

(56) References Cited

U.S. PATENT DOCUMENTS

| | | | |
|---|---|---|---|
| 3,370,047 A | 2/1968 | Raines | 260/78.5 |
| 3,715,330 A | 2/1973 | Nogami et al. | 260/40 |
| 4,011,386 A | 3/1977 | Matsumoto et al. | 526/259 |
| 4,106,943 A | 8/1978 | Ikeda et al. | 96/115 R |
| 4,126,738 A | 11/1978 | Gaylord | 526/271 |
| 4,202,955 A | 5/1980 | Gaylord | 526/272 |
| 4,440,850 A | 4/1984 | Paul et al. | 430/325 |
| 4,491,628 A | 1/1985 | Ito et al. | 430/176 |
| 4,857,435 A | 8/1989 | Hopf et al. | 430/192 |
| 4,883,740 A | 11/1989 | Schwalm et al. | 430/270 |
| 4,948,856 A | 8/1990 | Minchak et al. | 526/281 |
| 4,986,648 A | 1/1991 | Kobayashi et al. | 3551/160 R |
| 5,064,919 A | 11/1991 | Hara et al. | 526/169 |
| 5,087,677 A | 2/1992 | Brekner et al. | 526/160 |
| 5,212,043 A | 5/1993 | Yamamoto et al. | 430/192 |
| 5,252,427 A | 10/1993 | Bauer et al. | 430/270 |
| 5,278,214 A | 1/1994 | Moriya et al. | 524/238 |
| 5,324,804 A | 6/1994 | Steinmann | 526/313 |
| 5,585,219 A | 12/1996 | Kaimoto et al. | 430/270.1 |
| 5,738,975 A | 4/1998 | Nakano et al. | 430/280.1 |
| 5,843,624 A | 12/1998 | Houlihan et al. | 430/296 |
| 5,849,808 A | 12/1998 | Schacht et al. | 522/31 |
| 5,866,665 A | 2/1999 | Shaffer et al. | 526/348.4 |
| 6,028,153 A | 2/2000 | Jung | 526/258 |
| 6,045,967 A | 4/2000 | Jung et al. | 430/270.1 |
| 6,232,417 B1 * | 5/2001 | Rhodes et al. | 526/171 |

FOREIGN PATENT DOCUMENTS

| | | | |
|---|---|---|---|
| EP | 0071471 | 7/1982 | |
| EP | 0291970 | 11/1988 | C08F/210/02 |
| EP | 0789278 A2 | 2/1997 | |
| EP | 794458 A2 | 9/1997 | |
| EP | 0836119 A1 | 11/1997 | |
| EP | 0878738 A2 | 11/1998 | G03F/7/004 |

(List continued on next page.)

OTHER PUBLICATIONS

U.S. patent application Ser. No. 08/992,033, Jung et al., filed Dec. 17, 1997.
U.S. patent application Ser. No. 09/000,984, Jung et al., filed Dec. 30, 1997.
U.S. patent application Ser. No. 09/152,976, Jung et al., filed Sep. 14, 1998.
U.S. patent application Ser. No. 09/222,053, Jung et al., filed Dec. 29, 1998.
U.S. patent application Ser. No. 09/223,510, Jung et al., filed Dec. 30, 1998.

(List continued on next page.)

Primary Examiner—Tatyana Zalukaeva
(74) Attorney, Agent, or Firm—Townsend and Townsend and Crew LLP

(57) ABSTRACT

The present invention relates to photoresist monomers, polymers formed therefrom and photoresist compositions suitable for photolithography processes employing a DUV light source, such as KrF(249 nm) and ArF(193 nm); EUV; VUV; E-beam; ion-beam; and X-ray. Photoresist monomers of the present invention are represented by the following Chemical Formula 1:

Chemical Formula 1

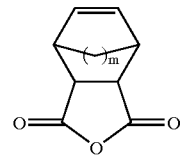

wherein, m is 1 or 2. Polymers of the present invention comprise repeating units derived from the comonomer of Chemical Formula 1, preferably together with monomers of the following Chemical Formula 2:

Chemical Formula 2

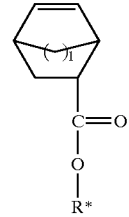

wherein, R* is an acid-labile group, and W is 1 or 2.

5 Claims, No Drawings

FOREIGN PATENT DOCUMENTS

| | | | |
|---|---|---|---|
| GB | 0768813 | 2/1957 | |
| GB | 1329997 | 9/1970 | |
| GB | 1342112 | 12/1973 | |
| GB | 1484061 | 8/1997 | ............ C08J/3/28 |
| GB | 1335095 | 10/1997 | |
| GB | 2320501 A | 6/1998 | |
| GB | 2320717 A | 7/1998 | |
| GB | 2320718 A | 7/1998 | ........... C08F/32/08 |
| GB | 2321060 A | 7/1998 | |
| GB | 2332679 A | 6/1999 | ......... C08F/232/08 |
| GB | 2336845 A | 11/1999 | ......... C08F/222/06 |
| GB | 2336846 A | 11/1999 | ......... C08F/222/40 |
| JP | 05297591 | 11/1993 | |
| NL | 128164 | 2/1977 | |
| WO | WO 96/37526 | 11/1996 | |
| WO | WO 97/06216 | 2/1997 | ........... C09D/5/00 |
| WO | WO 97/33198 | 9/1997 | |
| WO | WO 98/07759 | 2/1998 | ............ C08F/2/50 |
| WO | WO 99/14256 | 3/1999 | |

OTHER PUBLICATIONS

U.S. patent application Ser. No. 09/223,662, Jung et al., filed Dec. 30, 1998.

U.S. patent application Ser. No. 09/301,944, Jung et al., filed Apr. 29, 1999.

U.S. patent application Ser. No. 09/301,945, Jung et al., filed Apr. 29, 1999.

U.S. patent application Ser. No. 09/302,064, Lee et al., filed Apr. 29, 1999.

U.S. patent application Ser. No. 09/311,488, Jung et al., filed May 13, 1999.

U.S. patent application Ser. No. 09/360,402, Jung et al., filed Jul. 23, 1999.

U.S. patent application Ser. No. 09/383,861, Lee et al., filed Aug. 26, 1999.

U.S. patent application Ser. No. 09/383,547, Jung et al., filed Aug. 26, 1999.

D. Braun and Joannis Pomakis, *Uber Die Copolymerisation von Maleinsaureanhydrid Mit Bicyclo [2.2.1] Hept–5–En–2–Carbonsaure, European Polymer Journal*, (1974) vol. 10 [4]pp. 357–365. (Abstract only in English).

J. Byers et al., *Recent Advancements in Cycloolefen Based Resists for ArF Lithography, Journal of Photopolymer Science and Technology*, (1998) vol. II No. 3, pp. 465–474.

James V. Crivello and Sang–Yeon Shim, *Chemically Amplified Electron–Beam Photoresists, Chemical Mater.*, (1966) vol. 8, pp. 376–381.

F. M. Houlihan et al., *Photo Generators of Sulfamic Acids; Use in Chemically Amplified Single Layer Resists, Journal of Photopolymer Science and Technology*, (1998) vol. 11, No. 3, pp. 419–430.

Alexander A. Dobrev, Emile Perez, Jean Claud Ader, Armand Lattes, "First Application of Functionalized in the Ester Moiety Acrylates in Diels–Alder Reaction: Invluence of Solvents on Stereochemistry"; Bulgarian Chemical Communications, vol. 28, No. 2 (1995) pp. 253–258.

T.P. McGovern and C.E. Schreck, "Mosquito Repellents: Monocarboxylic Esters of Aliphatic Diols", Journal of the American Mosquito Control Association, vol. 4, No. 3, pp. 314–321.

*35–Synthetic High Polymers, Chemical Abstracts*, (1967) vol. 66, 76325, pp. 7178–7179.

CA Register No. 37503–43–8.

WPI Accession No. 94–227160[28] (FR2695540).

WPI Accession No. 90–049159[07] (JP2003404(elf)).

WPI Accession No. 99–076491 (JP10316720).

Japanese Patent Abstract 10017526.

Japanese Patent Abstract 08134015 A.

CA 121:10910 (JP 05310885).

CA 129:209337 (JP 10–218941).

CA 129:223219 (JP 10213912).

CA 1981–47831.

Uzodinma Okoroanyanwu et al., *New Single Layer Positive Photoresists for 193 nm Photolithography, SPIE*, vol. 3049, 1997, pp. 92–103.

CA 130:229879.

ACS Abstract Ref. 172992–05–1.

Thomas I. Wallow, et al., "Evaluation of Cycloolefin–Maleic Anhydride Alternating Copolymers as Single–Layer Photoresist for 193nm Photolithography", 1996, Proc. SPIE, vol. 2724, 355–364.

R.D. Allen et al., "The Influence of Photoacid Structure on the Design and Performance of 193nm Resists," 1997, Journal of Photopolymer Science and Technology, vol. 10, 503–510.

F.M. Houlihan et al., "A Commercially Viable 193nm single Layer Resist Platform", 1997, Journal of Photopolymer Science and Technology, vol. 10, 511–520.

J.C. Jung et al., "ArF Single Layer Resist Composed of Alicyclic Main Chain Containing Maleic Anhydride", 1997, Journal of Photopolymer Science and Technology, vol. 10, 529–533.

S. J. Choi et al., "New ArF Single–layer Resist for 193–nm Lithography", 1997, Journal of Photopolymer Science and Technology, vol. 10, 521–528.

T. Hattori et al., "Synthesis and Dissolution Characteristics of Novel Alicyclic Polymer With Monoacid Ester Structures". 1997, Journal of Photopolymer Science and Technology, vol. 10, 535–544.

K. Nozaki and Ei Yaro, "New Protective Groups in Methacrylate Polymer for 193–nm Resists", 1997, Journal of Photopolymer Science and Technology, vol. 10, 545–550.

K. Nakano et al., "Chemically Amplified Resist Based on High Etch–Resistant Polymer for 193–nm Lithography", 1997, Journal of Photopolymer Science and Technology, vol. 10, 561–569.

Jung et al., "Synthesis and Characterization of Alicyclic Polymers with Hydrophilic Groups for 193 nm Single Layer Resist," 1999, CA abstract 130:229879.

CA Abstract 127;227308 & Proc. SPIE–Int. Soc. Opt. Eng. (1997) 3049 Advances in Resist Technology and Processing XIV 92–103.

CA Abstract 127;227269 & J. Photopolym. Sci. Technol. (1997) 10(4) 529–534.

CA Abstract 66;18889 & Magy. Kem. Foly. (1966) 72(11)491–3.

CA Abstract No. 104:149512 & Macromolecules 19(4) 1266–8 (1986).

CA Abstract No. 91:124064 & Makromol. Chem. 180(8) 1975–88 (1979).

CA Abstract No. 113:24734 & JP 02 051511.

CA Abstract No. 124:317926 & Macromol. Rapid Commun. 17(3) 173–180 (1996).

CA Abstract No. 124:203171 & Macromolecules 29(8) 2755–63 (1996).

CA Abstract No. 199328–07–9.

\* cited by examiner

POLYMERS FOR PHOTORESIST AND PHOTORESIST COMPOSITIONS USING THE SAME

FIELD OF THE INVENTION

The present invention relates to photoresist monomers, polymers formed therefrom, and photoresist compositions containing same, more specifically, photoresist monomers, polymers and a photoresist compositions suitable for photolithography processes employing DUV (deep ultraviolet) light sources such as KrF(249 nm) and ArF(193 nm); EUV; VUV; E-beam; ion-beam; and X-ray.

BACKGROUND OF THE INVENTION

Recently, chemical amplification type DUV photoresists have been investigated in order to achieve high sensitivity in minute image formation processes for preparing semiconductor devices. Such photoresists are prepared by blending a photoacid generator and matrix resin polymer having acid labile group.

According to the reaction mechanism of such a photoresist, the photoacid generator generates acid when it is illuminated by a light source, and the main chain or branched chain of the resin is reacted with the generated acid to be decomposed or crosslinked. The polarity change of the resin induces solubility differences between the exposed portion and unexposed portion in the developing solution, to form a predetermined pattern.

In the lithography process, resolution depends upon the wavelength of the light source—the shorter the wavelength, the more minute pattern can be formed.

In general, a photoresist (hereinafter, abbreviated to as "PR") must satisfy various requisites such as excellent etching resistance, heat resistance and adhesiveness, and more preferably, it should be developable in 2.38% aqueous tetramethylammonium hydroxide (TMAH) solution. However, it is very difficult to synthesize a polymer that satisfies all of these requisites. For example, a polymer having a polyacrylate main chain can be easily synthesized, but it has poor etching resistance and has difficulties in the developing process. In order to secure-etching resistance, it has been considered to add an alicyclic unit to the main chain. However, in this case, it is very difficult to form a copolymer wherein the main chain is comprised entirely of alicyclic units.

As an attempt to solve the problems described above, Bell Research Center developed a polymer having the following chemical structure, wherein the main chain is substituted with norbornene, acrylate and maleic anhydride units.

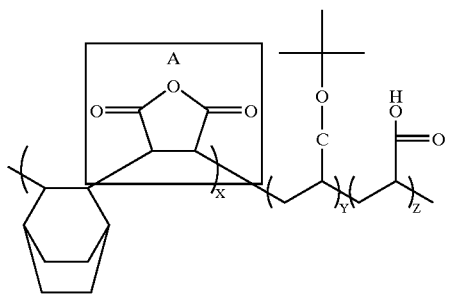

However, the above polymer has a problem in that the maleic anhydride moiety ('A' portion), which is employed to polymerize alicyclic olefin groups, is readily dissolved in 2.38 wt % aqueous TMAH solution even in an unexposed condition. Thus, in order to inhibit the dissolution of the polymer in the unexposed section, the ratio of 'Y' portion having tert-butyl substituent should be increased, but this results in a relative decrease of the 'Z' portion (which has a role of increasing adhesiveness to the substrate), and therefore the PR might be easily separated from the substrate at the time of patterning.

In order to solve the problem, cholesterol type dissolution inhibitors have been added to the polymer to form a two-component system. However, since the amount of the dissolution inhibitor is very high [about 30%(w/w) of the resin], reappearance is low and the production cost is high, thereby making the system unsuitable as a PR.

SUMMARY OF THE INVENTION

An object of the present invention is to provide PR monomers which can form polymers having excellent etching resistance, adhesiveness and photosensitivity, and processes for preparing the same.

Another object of the present invention is to provide PR polymers having excellent etching resistance, adhesiveness and photosensitivity, wherein the unexposed portion is not easily dissolved by developing solution, and processes for preparing the same.

Another object of the present invention is to provide photoresist compositions using the novel photoresist polymers described above, and processes for preparing the same.

In order to achieve the aforementioned objects, the present invention provides a photoresist monomer represented by the following Chemical Formula 1.

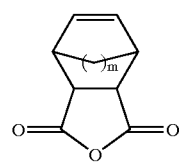

Chemical Formula 1 wherein, m is 1 or 2.

In order to achieve the other objects, the present invention provides photoresist copolymer comprising said monomer of Formula 1. Preferably, photoresist copolymers of the present invention comprise (i) a compound represented by the above mentioned Chemical Formula 1 as a first comonomer, and (ii) as a $2^{nd}$ comonomer, a compound represented by the following Chemical Formula 2:

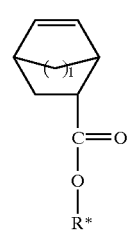

Chemical Formula 2 wherein,
R* is an acid-labile group, and
l is 1 or 2.

In order to achieve further objects of the present invention, a photoresist composition is provided which includes (i) a photoresist copolymer according to the present invention, (ii) a photoacid generator and (iii) an organic solvent.

DETAILED DESCRIPTION OF THE INVENTION

It has been found that polymers formed from the monomer represented by Chemical Formula 1 below (i) shows good etching resistance since it is a cycloolefin compound, (ii) has a good adhesiveness to a semiconductor substrate and (iii) has the preferred photosensitivity.

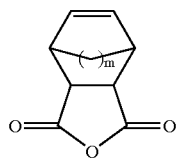

Chemical Formula 1 wherein, m is 1 or 2.

Considering the characteristics of the compound represented by the above Chemical Formula 1, we have found that a copolymer which comprises (i) the compound represented by Chemical Formula 1 as a first monomer, and (ii), as a second comonomer, the compound represented by the following Chemical Formula 2, which functions as an dissolution inhibitor, is suitable for photolithography employing short-wavelength light sources.

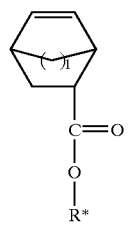

Chemical Formula 2 wherein,

R* is an acid-labile group, and l is 1 or 2.

In the Chemical formula 2, the R* is released when it is reacted with the acid generated by the photoacid generator. Thus, while the photoresist polymer in the exposed region becomes soluble in the developing solution, the polymer in the unexposed region is not dissolved in the developing solution because acid is not generated therein and thus the acid labile groups are still bound to the photoresist polymer. As the result, a predetermined pattern is formed.

In this way, the compound of Chemical Formula 2 has a role of enhancing photosensitivity of the photoresist polymer by increasing the difference in solubility in the developing solution between the exposed portion and the unexposed portion of the photo resist.

Though the acid labile group R* can have any structure that can be dissociated from the main alicyclic structure by reacting with an acid, preferable acid labile groups are tert-butyl, 2-tetrahydrofuranyl, 2-tetrahydropyranyl, 2-ethoxyethyl or t-butoxyethyl.

The photoresist copolymer according to the present invention can be prepared by using a polymerization initiator or by using a metal catalyst. In the case of synthesis using a polymerization initiator, maleic anhydride(Chemical formula 3) or maleimide derivatives can be added as a polymerization-enhancing monomer which makes the polymerization reaction between cycloolefin compounds more efficient. However, when performing polymerization using a metal catalyst, such polymerization-enhancing monomer is not necessarily required.

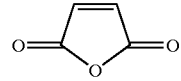

Chemical Formula 3

A compound having alcohol groups, as represented by the following Chemical Formula 4, can be further added as a monomer in order to intensify adhesion of the photoresist to the substrate. In addition, a monomer having at least one carboxylic acid group which is represented by the following Chemical Formula 5 may be added to the polymer in order to intensify photosensitivity.

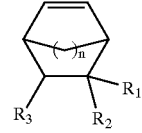

Chemical Formula 4 wherein, $R_1$ is —OH or —R—OH, wherein R is substituted or non-substituted ($C_1$-$C_{10}$) alkyl, substituted or non-substituted ($C_1$-$C_{10}$) ether, substituted or non-substituted ($C_1$-$C_{10}$) ester or, substituted or non-substituted ($C_1$-$C_{10}$) ketone, $R_2$ is H or $R_1$, $R_3$ is H or —COOR and n is 1 or 2.

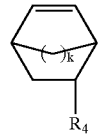

Chemical Formula 5 wherein,

R4 is —COOH or —R—COOH, k is 1 or 2 and

R is as same as defined in the Chemical Formula 4.

Preferably, the average molecular weight of the photoresist copolymer according to the present invention is between 3,000 to 100,000.

A synthesizing method using a polymerization initiator is performed by reacting the comonomers, including at least one of maleic anhydride and maleimide derivative monomer, together in an organic solvent in the presence of a polymerization initiator. Presently preferred organic solvents are tetrahydrofuran, dimethylformamide, dimethyl sulfoxide, dioxane, methyl ethyl ketone, benzene, toluene or xylene may be used. Conventional radical polymerization initiators such as 2,2-azobisisobutyronitile (AIBN), acetyl peroxide, lauryl peroxide and tert-butyl peroxide may be used.

Alternatively, conventional synthesizing methods using a metal catalyst can be performed without maleic anhydride and maleimide derivatives.

A photoresist composition according to the present invention, which is useful for photolithography processes employing deep ultraviolet light sources such as ArF, may be prepared by dissolving the photoresist copolymer according to the present invention in a conventional organic solvent together with a conventional photoacid generator.

Sulfide or onium type compounds are preferably used as the photoacid generator. The photoacid generator may be one or more compounds selected from the group consisting of diphenyl iodide hexafluorophosphate, diphenyl iodide hexafluoroarsenate, diphenyliodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate and dibutylnaphthylsulfonium triflate. The photoacid generator is used in an amount of 0.05 to 10% by weight of the photoresist copolymer employed. If the amount of the photoacid generator is less than 0.05% by weight, photosensitivity of the photoresist becomes poor. On the other hand, if the amount is more than 10%, the photoacid generator readily absorbs deep ultraviolet to provide a pattern having poor cross-sectional surface.

Conventional organic solvents, such as ethyl 3-ethoxypriopionate, methyl 3-methoxypropionate, cyclohexanone, propylene glycol methyl ether acetate, or the like, may be used. The amount of solvent used is 200 to 1000% by weight of the photoresist resin, in order to obtain a photoresist coating of desirable thickness. According to the experiments by the present inventors, when the amount of solvent is 600% by weight, a photoresist coating having a thickness of 0.5 μm is obtained.

A conventional photoresist pattern-forming method can be used with the photoresist composition prepared according to the present invention, for example as follows:

First, the photoresist composition of the present invention is spin-coated on a silicon wafer to form a thin film, which is then soft-baked (i.e. heated in an oven or on a hot plate at 70 to 200° C., preferably at 80 to 150° C. for 1 to 5 minutes), and exposed to light by using an exposing device employing a deep ultraviolet light source, such as ArF light and KrF light, which has a wavelength below 250 nm. Then, the wafer is post-baked (i.e. heated at 70 to 200° C., more preferably, 100 to 200° C.). Then, the wafer is impregnated in 2.38% aqueous TMAH developing solution for 1.5 minutes, to obtain a photoresist image.

In the above procedure, the exposure energy is preferably 0.1 to 30 mJ/cm² and, instead of the deep ultraviolet light source, an E-beam, X-ray, EUV, VUV(Vacuum Ultra Violet) or similar light source may be used.

By employing the photoresist composition according to the present invention, a line/space (L/S) photoresist pattern having excellent adhesiveness and resolution is obtained, without patten collapse, even when isolation is not more than 70 nm.

According to the present invention, a photoresist composition having excellent etching resistance and adhesiveness can be manufactured in large scale with low production cost, and a semiconductor element having excellent reliability can be prepared therefrom.

DETAILED DESCRIPTION OF PREFERRED EMBODIMENTS

The invention is described in more detail by referring to the examples below, but it should be noted that the present invention is by no means restricted to the examples.

SYNTHESIS OF PHOTORESIST COPOLYMER

EXAMPLES

Example 1

Synthesis of poly(cis-5-Norbornene-endo-2,3-dicarboxylic Anhydride/tert-butyl 5-Norbornene-2-carboxylate/maleic Anhydride/mono-methyl cis-5-Norbornene-endo-2,3-dicarboxylate/5-norbornene-2-carboxylic Acid)

Maleic anhydride (1.0 mole), cis-5-norbornene-endo-2,3-dicarboxylic anhydride (0.2 mole), mono-methyl cis-5-norbornene-endo-2,3-dicarboxylate (0.15 mole) and tert-butyl-5-norbornene-2-carboxylate (0.65 mole) are dissolved in tetrahydrofuran. Then, 0.5 to 10 g of AIBN (azobisisobutyronitrile) as a polymerization initiator is added thereto, and the resultant mixture is reacted at about 60–70° C. for 4 to 24 hours under nitrogen or argon atmosphere. The polymer thus obtained is precipitated from ethyl ether or hexane, and dried to obtain the compound represented by the following Chemical Formula 101.

Chemical Formula 101

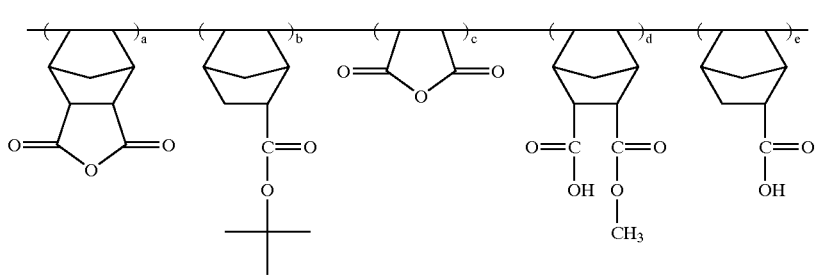

Example 2

Synthesis of Poly(cis-5-Norbornene-endo-2,3-dicarboxylic Anhydride/tert-butyl 5-Norbornene-2-carboxylate/maleic Anhydride/mono-methyl Bicyclo[2,2,2]oct-5-ene-2,3-dicarboxylate/5-norbornene-2-carboxylic Acid)

The procedure of Example 1 is repeated but using monomethyl-bicyclo[2,2,2]oct-5-ene-2,3-dicarboxylate (0.15 mole) instead of mono-methyl cis-5-norbornene-endo-2,3-dicarboxylate (0.15 mole), to obtain the compound represented by the following Chemical Formula 102.

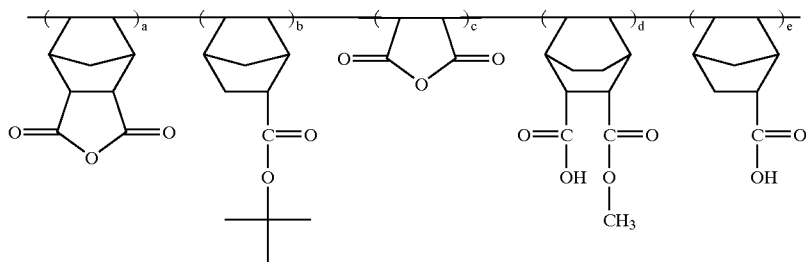

Chemical Formula 102

Example 3

Synthesis of poly(cis-5-Norbornene-endo-2,3-dicarboxylic Anhydride/tert-butyl 5-Norbornene-2-carboxylate/maleic Anhydride/5-norbornene-2,2-dimethanol 5-Norbornene-2-carboxylic Acid)

Maleic anhydride (1.0 mole), cis-5-norbornene-endo-2,3-dicarboxylic anhydride (0.2 mole), 5-norbornene-2,2-dimethanol (0.1 mole), tert-butyl 5-norbornene-2-carboxylate (0.65 mole) and 5-norbornene-2-carboxylic acid (0.05 mole) are dissolved in tetrahydrofuran.

Then, 0.5 to 10 g of AIBN (azobisisobutyronitrile) as a polymerization initiator is added thereto, and the resultant mixture is reacted at about 60–70° C. for 4 to 24 hours under nitrogen or argon atmosphere. The polymer thus obtained is precipitated from ethyl ether or hexane, and dried to obtain the compound represented by the following Chemical Formula 103.

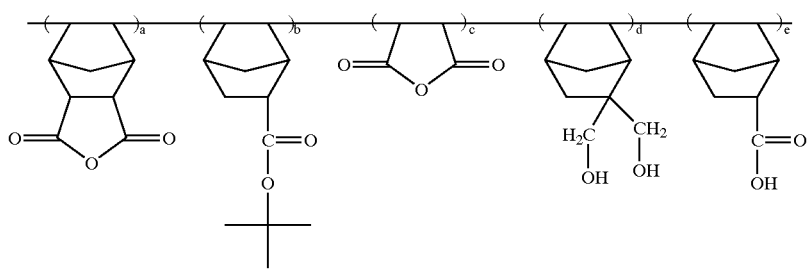

Chemical Formula 103

Example 4

Synthesis of Poly(cis-5-Norbornene-endo-2,3-dicarboxylic Anhydride/tert-butyl 5-Norbornene-2-carboxylate/maleic anhydride/5-norbornene-2-methanol/5-norbornene-2-carboxylic Acid)

The procedure of Example 3 is repeated but using 5-norbornene-2-methanol (0.1 mole) instead of 5-norbornene-2,2-dimethanol (0.1 mole), to obtain the compound represented by the following Chemical Formula 104.

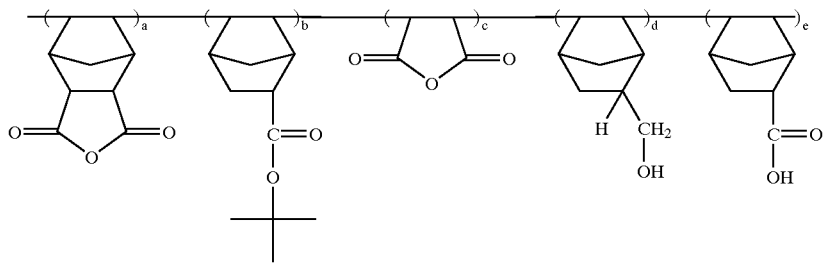

Chemical Formula 104

Example 5

Synthesis of poly(cis-5-Norbornene-endo-2,3-dicarboxylic Anhydride/tert-butyl 5-Norbornene-2-carboxylate/maleic Anhydride/5-norbornene-2-ol/5-norbornene-2-carboxylic Acid)

The procedure of Example 3 is repeated but using 5-norbornene-2-ol (0.1 mole) instead of 5-norbornene-2,2-dimethanol (0.1 mole), to obtain the compound represented by the following Chemical Formula 105.

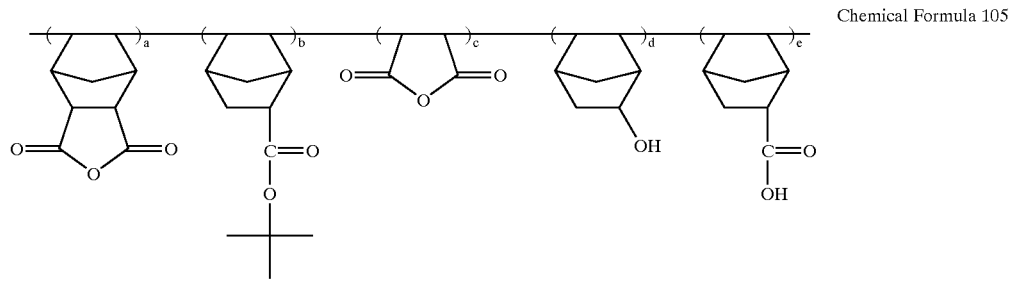

Chemical Formula 105

Example 6

Synthesis of Poly(cis-Bicyclo[2,2,2]oct-5-ene-2,3-dicarboxylic Anhydride/bicyclo[2,2,2]oct-5-ene-2-tert-butyl Carboxylate/maleic Anhydride/bicyclo[2,2,2]oct-5-ene-2,2-dimethanol/bicyclo[2,2,2]oct-5-ene-2-carboxylic Acid)

The procedure of Example 3 is repeated but using bicyclo[2,2,2]oct-5-ene-2,2-dimethanol (0.1 mole) instead of 5-norbornene-2,2-dimethanol (0.1 mole), cis-bicyclo[2,2,2]oct-5-ene-2,3-dicarboxylic anhydride (0.2 mole) instead of cis-5-norbornene-endo-2,3-dicarboxylic anhydride, bicyclo[2,2,2]oct-5-ene-2-tert-butyl carboxylate (0.65 mole) instead of tert-butyl 5-norbornene-2-carboxylate, and bicyclo[2,2,2]-oct-5-ene-2-carboxylic acid (0.05 mole) instead of 5-norbornene-2-carboxylic acid, to obtain the compound represented by the following Chemical Formula 106.

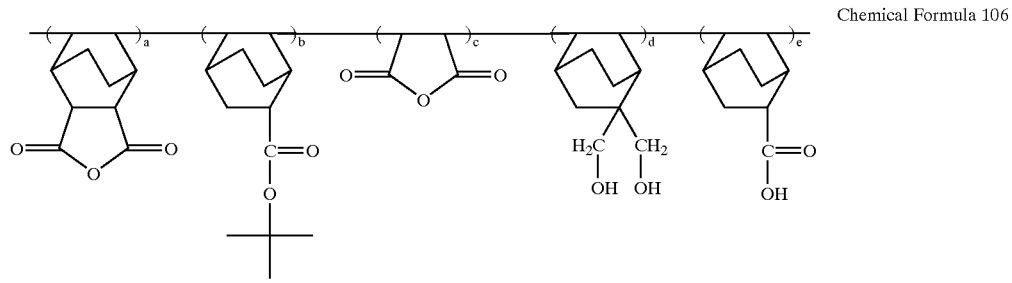

Chemical Formula 106

Example 7

Synthesis of poly(cis-Bicyclo[2,2,2]oct-5-ene-2,3-dicarboxylic Anhydride/bicyclo[2,2,2]oct-5-ene-2-tert-butyl Carboxylate/maleic Anhydride/bicyclo[2,2,2]oct-5-ene-2-methanol/bicyclo[2,2,2]oct-5-ene-2-carboxylic Acid)

The procedure of Example 6 is repeated but using bicyclo[2,2,2]oct-5-ene-2-methanol (0.1 mole) instead of bicyclo[2,2,2]oct-5-ene-2,2-dimethanol (0.1 mole), to obtain the compound represented by following Chemical Formula 107:

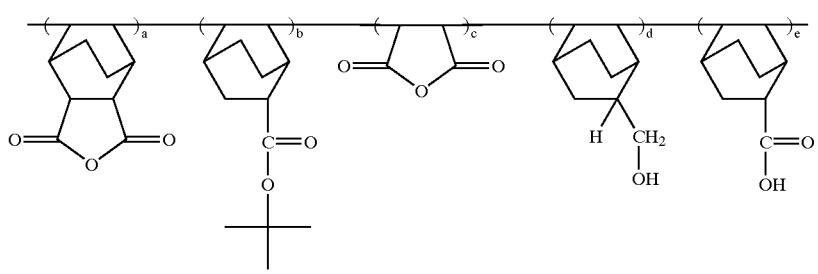

Chemical Formula 107

Example 8

Synthesis of Poly(cis-Bicyclo[2,2,2]oct-5-ene-2,3-dicarboxylic Anhydride/bicyclo[2,2,2]oct-5-ene-2-tert-butyl Carboxylate/maleic Anhydride/bicyclo[2,2,2]oct-5-ene-2-ol/bicyclo[2,2,2]oct-5-ene-2-carboxylic Acid)

The procedure of Example 6 is repeated but using bicyclo[2,2,2]oct-5-ene-2-ol (0.1 mole) instead of bicyclo[2,2,2]oct-5-ene-2-ol (0.1 mole), to obtain the compound represented by following Chemical Formula 108:

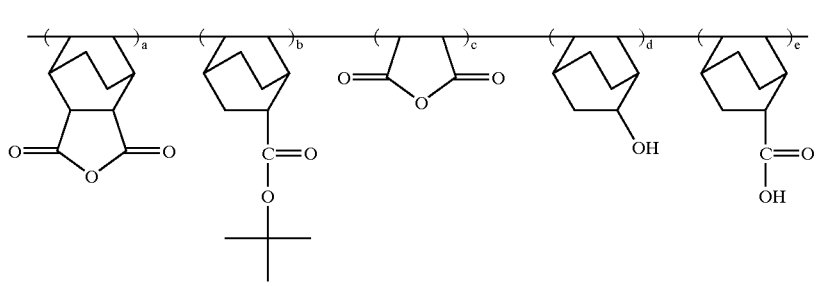

Chemical Formula 108

PREPARATION OF PHOTORESIST COMPOSITION AND MICROPATTERN FORMATION

Example 9

The photoresist copolymer represented by the Chemical Formula 101, obtained from the Example 1 (10 g) is dissolved in 40 g of 3-methoxymethyl propionate, and triphenylsulfonium triflate or dibutyl naphthyl sulfonium triflate(0.01–1 g) as a photoacid generator is added thereto. After stirring, the resultant mixture is filtered through a 0.10 μm filter to provide a PR composition according to the present invention.

The photoresist composition thus obtained is coated at 0.6 μm thickness on the substrate to form a photoresist film, and soft-baked in an oven or on a hot plate of 80 to 150° C. for 1 to 5 minutes.

Then, an exposing step is performed on the photoresist film with 193 nm ArF light source by using an exposing mask. The film is post-baked at 100 to 200° C. and impregnated in 2.38% aqueous TMAH solution for 1.5 minutes to obtain an 0.15 μm line/space (L/S) pattern.

Example 10

The procedure of Example 9 is repeated but using the photoresist copolymer represented by the Chemical Formula 102, obtained from the Example 2 (10 g), instead of Example 1, and thereby a 0.15 μm L/S pattern is formed.

Example 11

The procedure of Example 9 is repeated but using the photoresist copolymer represented by the Chemical Formula 103, obtained from the Example 3 (10 g) instead of Example 1, and thereby a 0.15 μlm L/S pattern is formed.

What is claimed is:

1. A photoresist copolymer comprising a monomer represented by the following Chemical Formula 1:

Chemical Formula 1 and at least one monomer selected from the group consisting of maleic anhydride and a maleimide derivative;

wherein, m is 1 or 2.

2. A photoresist copolymer according to claim 1 further comprising a comonomer represented by the following Chemical Formula 2:

Chemical Formula 2

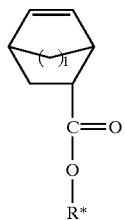

wherein,

R* is an acid-labile group, and l is 1 or 2.

3. A photoresist copolymer according to the claim 2, wherein R* is selected from the group consisting of tert-butyl, 2-tetrahydrofuranyl, 2-tetrahydropyranyl, 2-ethoxyethyl and t-butoxyethyl.

4. A photoresist copolymer according to the claim 2 further comprising at least one of the comonomer represented by the following Chemical Formula 4 and the compound represented by the following Chemical Formula 5:

<Chemical Formula 4>

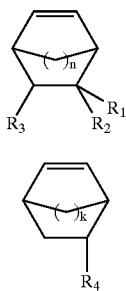

<Chemical Formula 5>

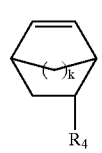

wherein, $R_1$ is —OH or —R—OH,

R is substituted or non-substituted ($C_1$–$C_{10}$) alkylene optionally comprising an ether, an ester or a ketone functional group, $R_2$ is H or $R_1$, $R_3$ is H or —COOR' (where R' is substituted or non-substituted ($C_1$–$C_{10}$) alkyl, optionally comprising an ether, an ester or a ketone functional group), n is 1 or 2, $R_4$ is —COOH or —R—COOH, and k is 1 or 2.

5. A photoresist copolymer according to the claim 2 selected from the group consisting of:

poly(cis-5-norbornene-endo-2,3-dicarboxylic anhydride/tert-butyl 5-norbornene-2-carboxylate/maleic anhydride/mono-methyl cis-5-norbornene-endo-2,3-dicarboxylate/5-norbornene-2-carboxylic acid);

poly(cis-5-norbornene-endo-2,3-dicarboxylic anhydride/tert-butyl 5-norbornene-2-carboxylate/maleic anhydride/mono-methyl bicyclo[2,2,2]oct-5-ene-2,3-dicarboxylate/5-norbornene-2-carboxylic acid);

poly(cis-5-norbornene-endo-2,3-dicarboxylic anhydride/tert-butyl 5-norbornene-2-carboxylate/maleic anhydride/5-norbornene-2,2-dimethanol/5-norbornene-2-carboxylic acid);

poly(cis-5-norbornene-endo-2,3-dicarboxylic anhydride/tert-butyl 5-norbornene-2-carboxylate/maleic anhydride/5-norbornene-2-methanol/5-norbornene-2-carboxylic acid);

poly(cis-5-norbornene-endo-2,3-dicarboxylic anhydride/tert-butyl 5-norbornene-2-carboxylate/maleic anhydride/5-norbornene-2-ol/5-norbornene-2-carboxylic acid);

poly(cis-bicyclo[2,2,2]oct-5-ene-2,3-dicarboxylic anhydride/bicyclo[2,2,2]oct-5-ene-2-tert-butyl carboxylate/maleic anhydride/bicyclo[2,2,2]oct-5-ene-2,2-dimethanol/bicyclo[2,2,2]oct-5-ene-2-carboxylic acid);

poly(cis-bicyclo[2,2,2]oct-5-ene-2,3-dicarboxylic anhydride/bicyclo[2,2,2]oct-5-ene-2-tert-butyl carboxylate/maleic anhydride/bicyclo[2,2,2]oct-5-ene-2-methanol/bicyclo[2,2,2]oct-5-ene-2-carboxylic acid); and poly(cis-bicyclo[2,2,2]oct-5-ene-2,3-dicarboxylic anhydride/bicyclo[2,2,2]oct-5-ene-2-tert-butyl carboxylate/maleic anhydride/bicyclo[2,2,2]oct-5-ene-2-ol/bicyclo[2,2,2]oct-5-ene-2-carboxylic acid).

* * * * *

UNITED STATES PATENT AND TRADEMARK OFFICE
CERTIFICATE OF CORRECTION

PATENT NO. : 6,569,971 B2
DATED : May 27, 2003
INVENTOR(S) : Chi Hyeong Roh and Jae Chang Jung It is certified that error appears in the above-identified patent and that said Letters Patent is hereby corrected as shown below:

Column 1,
Lines 52-65, please replace the formual with the following formula:

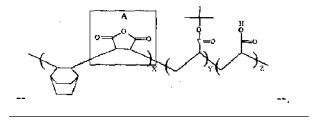

Signed and Sealed this

Seventeenth Day of August, 2004

JON W. DUDAS
*Acting Director of the United States Patent and Trademark Office*